United States Patent [19]

Singer et al.

[11] Patent Number: 4,565,710
[45] Date of Patent: Jan. 21, 1986

[54] PROCESS FOR PRODUCING CARBIDE COATINGS

[75] Inventors: Irwin L. Singer, Alexandria; Russell A. Jeffries, Arlington, both of Va.

[73] Assignee: The United States of America as represented by the Secretary of the Navy, Washington, D.C.

[21] Appl. No.: 617,777

[22] Filed: Jun. 6, 1984

[51] Int. Cl.⁴ ............................................. B05D 3/06
[52] U.S. Cl. ....................................... 427/35; 427/38; 148/191
[58] Field of Search .............. 427/38, 35; 204/192 N; 250/492.3; 148/191

[56] References Cited

U.S. PATENT DOCUMENTS

| | | | |
|---|---|---|---|
| 3,701,696 | 10/1972 | Mets | 148/191 |
| 3,718,502 | 2/1973 | Gibbons | |
| 3,832,219 | 8/1974 | Nelson et al. | 427/38 |
| 3,900,636 | 8/1975 | Curry et al. | 427/38 |
| 3,925,116 | 12/1975 | Ensel | 204/192 N |
| 4,105,443 | 8/1978 | Dearnaley et al. | 427/38 |
| 4,299,860 | 11/1981 | Schaefer et al. | 427/53.1 |
| 4,346,123 | 8/1982 | Kaufman | 427/38 |
| 4,364,969 | 12/1982 | Dearnaley et al. | 427/38 |
| 4,371,403 | 2/1983 | Ikubo et al. | 427/93 |
| 4,433,005 | 2/1984 | Manty et al. | 427/38 |

Primary Examiner—John H. Newsome
Attorney, Agent, or Firm—Robert F. Beers; William T. Ellis; Barry A. Edelberg

[57] ABSTRACT

A surface alloy is formed upon a solid alloy substrate by implanting ions into a heated solid substrate. By this method, for example, an Ti binary surface alloy may be formed upon a carbon steel. Also, this process allows solid-state gettering of selected minority solutes in alloys.

20 Claims, 2 Drawing Figures

PROCESS FOR PRODUCING CARBIDE COATINGS

BACKGROUND OF THE INVENTION

This invention relates generally to surface alloying and more particularly to surface alloying by ion implantation.

In many instances, it is desirable to produce a coating having special characteristics on the surface of a metal. For example, it may often be useful to have a tough, wear-resistant coating of metal carbide on a steel substrate. Additionally, at times it may be desirable to complex minority solutes in alloys to prevent these minority solutes from adversely affecting surface properties, e.g., adhesion, corrosion resistance, etc., at higher temperatures. For example, in nickel based superalloys, titanium atoms tend to migrate to the surface at high temperatures and react with oxygen, forming titanium oxide. The titanium oxide particles, which nucleate and grow at the surface of the alloys, deleteriously alter the oxidation characteristics. The complexing of potentially troublesome minority solutes in alloys is referred to as solid-state gettering.

OBJECTS OF THE INVENTION

It is an object of this invention to provide a process for forming a surface alloy upon a solid alloy substrate.

It is another object of this invention to provide a method for the solid-state gettering of minority solutes in an alloy.

It is a further object of this invention to provide an ion implantation process for producing a surface alloy upon a solid alloy substrate.

SUMMARY OF THE INVENTION

These and other objects are achieved by implanting monatomic ions into a solid heated alloy substrate, the ions being selected to react preferentially with a selected minority solute of the alloy. The alloy must be sufficiently heated to allow migration of atoms of the minority solute to surface where reaction with the implanted ions and subsequent nucleation can occur.

DESCRIPTION OF THE PREFERRED EMBODIMENT

Figure 1:
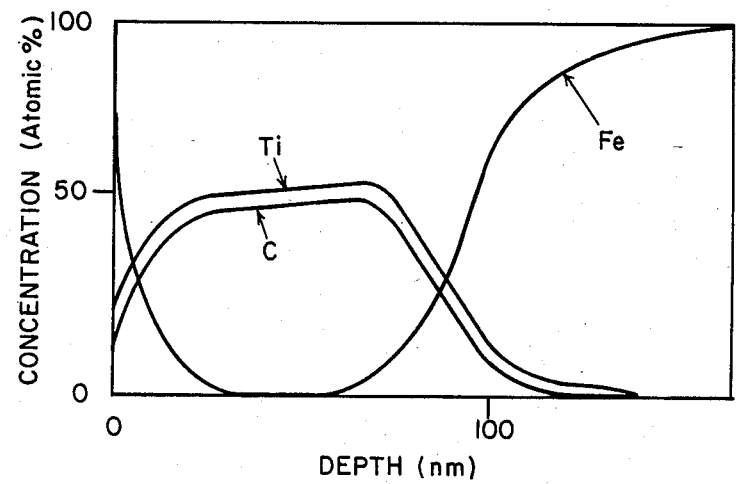
FIG. 1 is a graph of concentration vs. depth for a carbon steel implanted with titanium according to the process of this invention.

Throughout this specification and the claims that follow, "S" represents the substrate "M" represents the atoms of the selected minority solute of the substrate alloy and "I" represents the implanted ion species, unless otherwise indicated. The term "minority solute" indicates a solute present in less than about 4 atomic percent, and preferably less than about 1 atomic percent, in the alloy substrate, that is more reactive than the non-minority constituent of the substrate with the implanted ions.

In one embodiment of this invention, ions are implanted into a solid heated alloy substrate. The ions react with a selected minority solute which has migrated to the surface region to form a M-I alloy on the surface of the substrate alloy, S.

In another embodiment a selected minority solute is complexed by implanting ions into the surface of a solid heated alloy substrate. The selected minority solute atoms migrate to the surface of the substrate and react with the implanted ions, thus preventing the minority solute from precipitating out of the alloy at high temperatures.

It can be seen from the above that each embodiment is essentially similar. Indeed, through judicious selection of the implanting ion species the process of this invention might be used to getter minority solutes and at the same time form a desirable surface alloy of M-I.

In the process of this invention, a solid alloy substrate containing at least one minority solute is heated to a sufficient temperature to allow migration of a selected minority solute in the substrate to the surface. When the solid substrate is so heated, the bombarding ions react with the selected minority solute of to form a surface alloy. Heating may be achieved separate from or by the power introduced by the ion beam.

The alloy forms to approximately a depth commensurate with the stopping distance of the implanted ion. Inward or outward migration of the ion species and alloy constituents, as determined by diffusion, establishes the thickness of the surface alloy.

Almost any engineering alloy should be amenable to treatment by the process of this invention. For example, the substrate may be a carbon steel or a nickel-based super-alloy. Most preferably the substrate is a carbon steel. When steel is implanted under the proper conditions with titanium (Ti), vanadium (V), zirconium (Zr), niobium (Nb), hafnium (Hf) or tantalum (Ta) ions, a surface alloy of the appropriate metal carbide is formed. In nickel-based super-alloys, surface segregating titanium may be gettered by ion implantation with, for example, silicon, boron, or oxygen ions to form titanium silicides, borides or oxides, respectively. Surface segregating boron in nickel-based superalloys may be gettered by implanting titanium ions.

The temperature at which the ions are implanted into the substrate is dependent upon the substrate composition, the minority atom species selected and the ion implanted. At the moment, there is no apparant empirical relationship which may be used to preselect the proper temperatures and conditions for implantation of any particular ion-species into a particular solid alloy substrate to produce a desired surface alloy. Nevertheless, proper conditions should be capable of deduction through routine experimentation. Generally, heavier ion species require a substrate at a higher temperature. Most likely, this higher temperature allows some necessary diffusion of the ions. These diffusing ions then collide and react with outwardly migrating minority solute atoms to form a surface alloy.

At some temperatures, more than one minority solute may migrate to the surface of the substrate and react with the implanted ion. The result should be a surface alloy containing the minority solutes which have migrated to the surface of the substrate and the implanted ion species.

EXAMPLE

Having described the invention in general, the following example is being given to illustrate the principles of the invention and is not intended to limit the scope of the invention in any manner.

Figure 2:
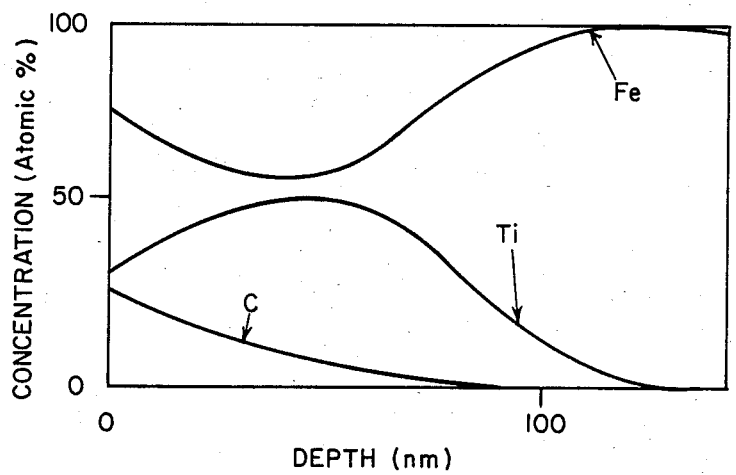
FIG. 2 is a graph of concentration vs. depth for a carbon steel implanted with titanium according to conventional means.

Titanium ions were implanted at an current density of 20–50 microamps/cm$^2$ and an energy of 50–200 KeV per ion into a thermally isolated carbon steel. The temperature of the carbon steel was raised by the energy of the beam to about 600° C. Implantation was continued for some time after the substrate attained 600° C. until the desired amount of titanium was incorporated into the surface. The composition of the surface alloy, shown in FIG. 1, is principally TiC. When ion implantation was performed without heating, the results were as shown in FIG. 2, where implanted titanium and carbon absorbed from the vacuum simply dilute the bulk iron. In contrast, FIG. 1 indicates that in the steel implanted at 600° C., carbon from the bulk migrated to the surface (decarborization) to react with titanium and displace iron atoms, and a nearly stoichiometric TiC layer formed in the first 100 nm. These observations were later confirmed by independent analysis of the surface alloy. High temperature and collision cascades are believed to promote mixing and assist thermal processes in effecting the formation of TiC.

An advantage of the process of this invention is that the high implantation temperaturees yield a homogeneous layer of surface alloy, especially when titanium is implanted into carbon steel. This homogeniety represents a significant improvement over other methods of surface alloying.

The process of this invention may also be used to getter impurities in semiconductors (e.g., silicon). Titanium, yttrium, or any other sronger oxide or carbide former than the base material, may be implanted into the substrate.

Obviously, many modifications and variations of the present invention are possible in light of the above teaching. It is therefore to be understood that, within the scope of the appended claims, the invention may be practiced otherwise than as specifically described.

What is claimed and desired to be secured by Letters Patent of the United States is:

1. A method of treating the surface of a substrate comprising an alloy, comprising the steps of:
    selecting a solid substrate, said substrate comprising an alloy having at least one minority solute;
    selecting one of said minority solutes;
    bombarding the surface of said substrate with an ion beam of a monatomic ion species, while said substrate is heated, at such an ion beam energy and substrate temperature that said selected minority solute migrates to the surface of said substrate and said monatomic ion species and minority solute react to form a surface alloy comprising the neutral atom of said ion species and said minority solute at the surface of said soiid substrate.

2. The process of claim 1 wherein said monatomic ion species comprises titanium, vanadium, zirconium, niobium, hafnium, tantalum, silicon or oxygen.

3. The process of claim 2 wherein said solid substrate comprises a nickel based superalloy or carbon steel.

4. The process of claim 3 wherein said solid substrate comprises carbon steel.

5. The process of claim 4 wherein said monatomic ion species comprises titanium, vanadium, zirconium, niobium, hafnium, tantalum or silicon.

6. The process of claim 5 wherein said bombardment step is performed while said substrate is at at least 600° C.

7. The process of claim 6 wherein said ion species comprises titanium or vanadium.

8. The process of claim 7 wherein the energy for heating said substrate is provided by said ion beam.

9. The process of claim 8 wherein said ion beam has an current density of about 20–50 microamps/cm$^2$ and an energy of about 50–200 KeV per ion.

10. A method of treating the surface of a substrate comprising an alloy, comprising the steps of:
    selecting a solid substrate, said substrate comprising an alloy having at least one minority solute;
    bombarding the surface of said substrate with an ion beam of a monatomic ion species, while said substrate is heated, at such an ion beam energy and substrate temperature that at least one minority solute migrates to the surface of said substrate and said monatomic ion species and at least one of said minority solute or solutes which have migrated to the surface of said substrate react to form a surface alloy consisting essentially of the neutral atom of said ion species and at least one of said minority solute or solutes which have migrated to the surface of said solid substrate.

11. The process of claim 10 wherein said monatomic ion species comprises titanium, vanadium, zirconium, niobium, hafnium, tantalum, silicon or oxygen.

12. The process of claim 11 wherein said solid substrate comprises a nickel-based superalloy or carbon steel.

13. The process of claim 12 wherein said solid substrate comprises a carbon steel.

14. The process of claim 13 wherein said monatomic species comprises titanium, vanadium, zirconium, niobium, hafnium, tantalum or silicon.

15. The process of claim 14 wherein said bombardment step is performed while said substrate is at at least 600° C.

16. The process of claim 15 wherein said ion species comprises titanium or vanadium.

17. The process of claim 16 wherein the energy for heating said substrate is provided by said ion beam.

18. The process of claim 17 wherein said ion beam has a current density of about 20–50 microamps/cm$^2$ and an energy of about 50–200 KeV per ion.

19. A method of treating the surface of a substrate comprising an alloy, comprising the steps of:
    selecting a solid silicon substrate, said substrate having at least one minority solute;
    bombarding the surface of said substrate with an ion beam of titanium or yttrium ions, while said substrate is heated, at such an ion beam energy and substrate temperature that at least one minority solute migrates to the surface of said substrate and said titanium or yttrium ions and at least one of said minority solutes which have migrated to the surface of said substrate react to form a surface alloy essentially consisting of the neutral atom of said ion species and at least one of said minority solute or solutes which have migrated to the surface of said solid substrate.

20. The process of claim 19 wherein the energy for heating said substrate is provided by said ion beam.

* * * * *